(12) United States Patent
Kira et al.

(10) Patent No.: US 9,793,221 B2
(45) Date of Patent: Oct. 17, 2017

(54) SEMICONDUCTOR DEVICE MOUNTING METHOD

(71) Applicant: FUJITSU LIMITED, Kawasaki-shi, Kanagawa (JP)

(72) Inventors: Hidehiko Kira, Nagano (JP); Norio Kainuma, Nagano (JP); Takashi Kubota, Chikuma (JP); Takumi Masuyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/009,969

(22) Filed: Jan. 29, 2016

(65) Prior Publication Data

US 2016/0284566 A1    Sep. 29, 2016

(30) Foreign Application Priority Data

Mar. 25, 2015  (JP) .................... 2015-063252

(51) Int. Cl.
*H01L 23/00* (2006.01)
*H01L 23/544* (2006.01)
*H01L 23/31* (2006.01)

(52) U.S. Cl.
CPC ........ *H01L 23/544* (2013.01); *H01L 23/3157* (2013.01); *H01L 24/14* (2013.01); *H01L 24/27* (2013.01); *H01L 24/29* (2013.01); *H01L 24/32* (2013.01); *H01L 24/73* (2013.01); *H01L 24/81* (2013.01); *H01L 24/83* (2013.01); *H01L 24/92* (2013.01); *H01L 24/13* (2013.01); *H01L 24/16* (2013.01); *H01L 24/94* (2013.01); *H01L 2223/5442* (2013.01); *H01L 2223/54426* (2013.01); *H01L 2223/54473* (2013.01); *H01L 2223/54486* (2013.01); *H01L 2224/131* (2013.01); *H01L 2224/13144* (2013.01); *H01L 2224/13147* (2013.01);
(Continued)

(58) Field of Classification Search
CPC ............ H01L 21/4814; H01L 2021/60; H01L 2021/60015; H01L 2021/60022; H01L 2021/6027; H01L 2021/60277
See application file for complete search history.

(56) References Cited

U.S. PATENT DOCUMENTS

2011/0249106 A1* 10/2011 Makino ................ H04N 5/2254
                                                            348/76
2012/0225522 A1*  9/2012 Zhao ..................... H01L 25/105
                                                            438/107
(Continued)

FOREIGN PATENT DOCUMENTS

JP      2009-147231      7/2009
JP      2011-181586      9/2011

*Primary Examiner* — Cheung Lee
(74) *Attorney, Agent, or Firm* — Fujitsu Patent Center

(57) ABSTRACT

A first insulating film is applied onto a joining face of a semiconductor device including a connection terminal on a joining face, and the connection terminal is embedded inside the first insulating film. The second insulating film is formed on a joining target face of a joining target, which includes a connection target terminal on the joining target face, and the connection target terminal is embedded inside the second insulating film. The semiconductor device and the joining target are joined together by applying pressure and causing the semiconductor device and the joining target to make contact with each other.

14 Claims, 14 Drawing Sheets

(52) U.S. Cl.
CPC ............ *H01L 2224/16227* (2013.01); *H01L 2224/16238* (2013.01); *H01L 2224/279* (2013.01); *H01L 2224/2783* (2013.01); *H01L 2224/27334* (2013.01); *H01L 2224/27436* (2013.01); *H01L 2224/27632* (2013.01); *H01L 2224/29011* (2013.01); *H01L 2224/29019* (2013.01); *H01L 2224/2919* (2013.01); *H01L 2224/2929* (2013.01); *H01L 2224/29076* (2013.01); *H01L 2224/29082* (2013.01); *H01L 2224/29299* (2013.01); *H01L 2224/3201* (2013.01); *H01L 2224/32057* (2013.01); *H01L 2224/32225* (2013.01); *H01L 2224/73104* (2013.01); *H01L 2224/73204* (2013.01); *H01L 2224/75301* (2013.01); *H01L 2224/75745* (2013.01); *H01L 2224/75753* (2013.01); *H01L 2224/8113* (2013.01); *H01L 2224/81132* (2013.01); *H01L 2224/81193* (2013.01); *H01L 2224/81203* (2013.01); *H01L 2224/81205* (2013.01); *H01L 2224/81207* (2013.01); *H01L 2224/81815* (2013.01); *H01L 2224/81895* (2013.01); *H01L 2224/8313* (2013.01); *H01L 2224/83132* (2013.01); *H01L 2224/83191* (2013.01); *H01L 2224/83193* (2013.01); *H01L 2224/83203* (2013.01); *H01L 2224/83862* (2013.01); *H01L 2224/92* (2013.01); *H01L 2224/9211* (2013.01); *H01L 2224/94* (2013.01); *H01L 2924/0665* (2013.01)

(56) References Cited

U.S. PATENT DOCUMENTS

| | | | |
|---|---|---|---|
| 2013/0009321 A1* | 1/2013 | Kagawa | H01L 21/76807 257/774 |
| 2014/0117546 A1* | 5/2014 | Liu | H01L 24/80 257/751 |
| 2015/0294955 A1* | 10/2015 | Chen | H01L 25/0657 257/777 |

\* cited by examiner

SEMICONDUCTOR DEVICE MOUNTING METHOD

CROSS-REFERENCE TO RELATED APPLICATION

This application is based upon and claims the benefit of priority of the prior Japanese Patent Application No. 2015-063252, filed on Mar. 25, 2015, the entire contents of which are incorporated herein by reference.

FIELD

The embodiments discussed herein are related to a semiconductor device mounting method.

BACKGROUND

The following technology is known in relation to semiconductor device mounting methods. For example, a mounting method is known in which a semiconductor chip that is formed with an insulating adhesive layer so as to embed a bump electrode on the circuit upper face is prepared, and the semiconductor chip is pressure bonded to a mounting board, with an anisotropic adhesive layer interposed between the insulating adhesive layer and a planar electrode of the mounting board.

Moreover, mounting technology is known in which a flexible circuit board and a printed circuit board are pressed together, with an anisotropic film and an insulating paste in between, and a circuit electrode of the flexible circuit board is joined to a circuit electrode of the printed circuit board.

RELATED PATENT DOCUMENTS

Japanese Patent Application Laid-open (JP-A) No. 2009-147231 JP-A No. 2011-181586

SUMMARY

According to an aspect of the embodiments, a semiconductor device mounting method includes: applying a first insulating film onto a joining face of a semiconductor device having a connection terminal on the joining face, and embedding the connection terminal inside the first insulating film; applying a second insulating film onto a joining target face of a joining target having a connection target terminal on the joining target face, and embedding the connection target terminal inside the second insulating film; and applying pressure that causes the connection terminal and the connection target terminal to contact each other, and joining the semiconductor device to the joining target.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1A:
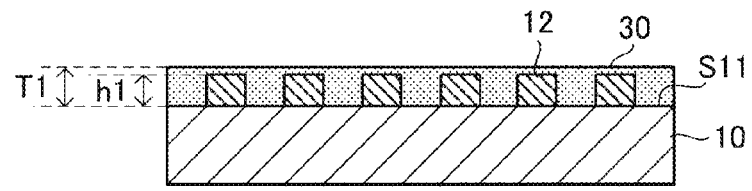
FIG. 1A is a diagram illustrating a semiconductor device mounting method according to a first exemplary embodiment of technology disclosed herein.

An under-filling method, in which a liquid-state under-filler is infilled into a space between a semiconductor device and a mounting board after mounting the semiconductor on the mounting board, is a known method of mounting a semiconductor device, having a protruding electrode such as a bump as a connection terminal, to a mounting board. In this under-filling method, as the surface area of the semiconductor device increases, it becomes difficult to infill the under-filler without causing a space (void) to arise between the semiconductor device and the mounting board.

However, NCF methods are known in which, in a state in which an insulating film known as a non-conductive film (NCF) is interposed between a semiconductor device and a mounting board, pressure is applied to press the semiconductor device against the mounting board, and the connection terminal of the semiconductor device is joined to a connection target terminal of the mounting board. NCFs are, for example, applied onto a joining face of semiconductor devices such that the connection terminal of the semiconductor device is covered. NCF methods enable the risk of a space (void) being created to be reduced compared to under-filling methods.

However, in NCF methods, the pressure (mounting load) needed to join the connection terminals of the semiconductor device and the mounting board together is larger than in under-filling methods. As the surface area of the semiconductor device to be mounted increases, a greater mounting load is needed, and the maximum mounting load that a chip bonder can supply is sometimes exceeded. The use of low-viscosity NCF may be considered in response to this issue. However, when low-viscosity NCF is employed, the flow rate of the NFC increases when applying pressure (mounting load), with Karman vortices readily arising in the vicinity of the connection terminals. As a result, the risk of spaces (voids) being generated increases in the vicinity of the connection terminals, with concern that reliability may fall.

Explanation follows regarding an exemplary embodiment of technology disclosed herein, with reference to the drawings. Note that in each of the drawings, identical or equivalent configuration elements and portions are allocated the same reference numeral.

First Exemplary Embodiment

FIG. 1A to FIG. 1D are diagrams illustrating a mounting method for a semiconductor device according to a first exemplary embodiment of technology disclosed herein. The mounting method according to the present exemplary embodiment mounts a semiconductor device 10 to a mounting board 20 using an NCF method.

As an example, the semiconductor device 10 is configured by a semiconductor chip installed with a circuit for implementing a specific function. A joining face S11 of the semiconductor device 10 that is to be joined to the mounting board 20 includes plural connection terminals 12 protruding from the joining face S11. The plural connection terminals 12 are disposed, for example, in a lattice pattern on the joining face S11. Each of the connection terminals 12 is, for example, configured by a protruding electrode, such a solder bump, a gold bump, or a copper bump. Note that the semiconductor device 10 is an example of a semiconductor device of technology disclosed herein, and the connection terminal 12 is an example of a connection terminal of technology disclosed herein.

The mounting board 20 is a joining target for joining the semiconductor device 10 onto, and may, for example, be configured by a printed substrate, a silicon interposer, or a semiconductor chip. The mounting board 20 includes plural connection target terminals 22 on a joining target face S21 protruding from the joining target face S21, and the joining target face S21 joins to the semiconductor device 10. The plural connection target terminals 22 are arrayed according to the array of the connection terminals 12 of the semiconductor device 10. Note that the mounting board 20 is an example of a joining target of technology disclosed herein, and the connection target terminal 22 is an example of a connection target terminal of technology disclosed herein.

Initially, an NCF 30 is applied onto the joining face S11 of the semiconductor device 10 (FIG. 1A). The NCF 30 is an insulating film configured including a thermosetting resin such as an epoxy resin. The NCF 30 is applied onto the joining face S11 of the semiconductor device 10 in a state in which the NCF 30 is softened by heating to a specific temperature lower than the thermosetting temperature. Each of the connection terminals 12 is embedded within the NCF 30 due to the NCF 30 being softened. Note that although a state in which the connection terminals 12, including their leading ends, are entirely embedded in the NCF 30 is illustrated in FIG. 1A, the leading end of each of the connection terminals 12 may be exposed from the NCF 30. The NCF 30 employed has a thickness T1 equal to the height h1 of the connection terminal 12, or is slightly thicker than the height h1 of the connection terminal 12. Namely, the mounting load needed to join the semiconductor device 10 and the mounting board 20 can be reduced as the thickness of the portion of the NCF 30 covering the leading ends of the connection terminals 12 (T1-h1) is set thinner.

The NCF 30 may be applied onto a semiconductor device 10 that is in a wafer state prior to dicing, or may be applied onto a semiconductor device 10 that has been cut into a chip by dicing. Note that the NCF 30 is an example of a first insulating film of technology disclosed herein.

Figure 1B:
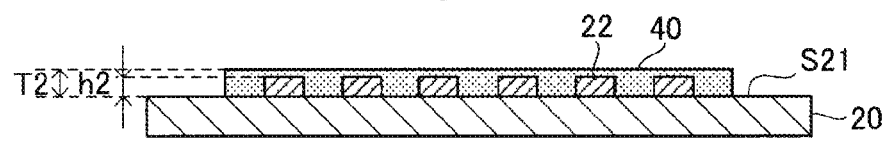
FIG. 1B is a diagram illustrating a semiconductor device mounting method according to the first exemplary embodiment of technology disclosed herein.

Next, an NCF 40 is applied onto the joining target face S21 of the mounting board 20 (FIG. 1B). The NCF 40 is an insulating film configured including a thermosetting resin such as an epoxy resin, similar to the NCF 30 applied onto the semiconductor device 10. The NCF 40 may be configured including the same resin as the NCF 30. The NCF 40 is applied onto the joining target face S21 of the mounting board 20 in a state in which the NCF 40 is softened by heating to a specific temperature lower than the thermosetting temperature. Each of the connection target terminals 22 is embedded within the NCF 40 due to the NCF 40 being softened. Note that although a state in which the connection target terminals 22, including their leading ends, are entirely embedded in the NCF 40 is illustrated in FIG. 1B, the leading end of each of the connection target terminals 22 may be exposed from the NCF 40. The NCF 40 employed has a thickness T2 equal to the height h2 of the connection target terminal 22, or is slightly thicker than the height h2 of the connection target terminal 22. Namely, the mounting load needed to join the semiconductor device 10 and the mounting board 20 can be reduced as the thickness of the portion of the NCF 40 covering the leading ends of the connection target terminals 22 (T2-h2) is set thinner. Moreover, the summed thickness of the thickness of the portion of the NCF 30 covering the leading ends of the connection terminals 12 (T1-h1) and the thickness of the portion of the NCF 40 covering the leading ends of the connection target terminals 22 (T2-h2) is preferably thinner than the smaller out of the out of the height of the connection terminals 12 (h1) and the height of the connection target terminals 22 (h2). Note that the NCF 40 is an example of a second insulating film of technology disclosed herein.

Figure 1C:
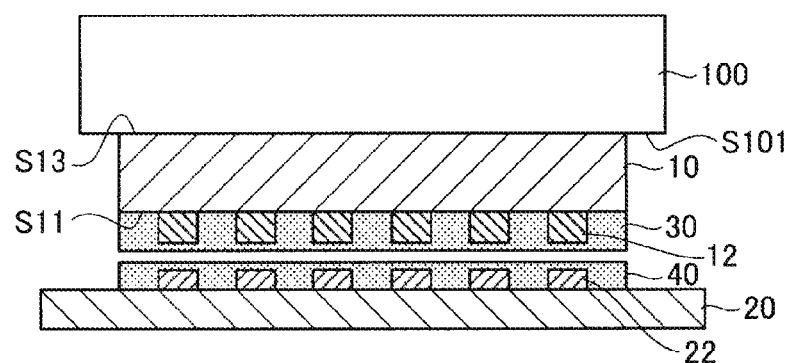
FIG. 1C is a diagram illustrating a semiconductor device mounting method according to the first exemplary embodiment of technology disclosed herein.

Next, the semiconductor device 10 is picked up by suctioning a rear face S13, which is on the opposite side to the side of the joining face S11 of the semiconductor device 10, to a suction face S101 of a bonding tool 100 of a chip bonder. Then, the positions of the semiconductor device 10 and the mounting board 20 are aligned by a position determining mechanism of the chip bonder (FIG. 1C).

Figure 1D:
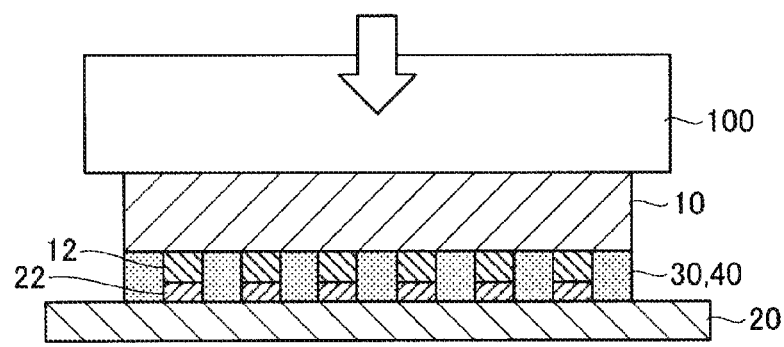
FIG. 1D is a diagram illustrating a semiconductor device mounting method according to the first exemplary embodiment of technology disclosed herein.

Next, the bonding tool 100 is lowered while still holding the semiconductor device 10, and heat is applied to the semiconductor device 10 while the respective connection terminals 12 of the semiconductor device 10 are caused to contact the respective connection target terminals 22 of the mounting board 20 by applying pressure (mounting load) (FIG. 1D). The NCF 30 and the NCF 40 are temporarily softened by the heat. Surplus NCF 30 and 40 extending between the connection terminals 12 and the connection target terminals 22 flows out as it is pressed by the pressure (mounting load) applied from the bonding tool 100. The connection terminals 12 and the connection target terminal 22 thereby contact each other.

When the connection terminals 12 are, for example, solder bumps, heat is supplied at a temperature higher than the melting temperature of the solder bumps. The connection terminals 12 and the connection target terminals 22 are joined together by causing the solder bumps to melt. Then, the NCF 30 and 40 are cured by continuing to supply heat from the bonding tool 100.

When the connection terminals 12 are, for example, gold bumps, the connection terminals 12 and the connection target terminals 22 are joined together by pressure bonding.

Note that in cases in which the connection terminals 12 and the connection target terminals 22 are joined together by pressure bonding, ultrasonic waves may be applied to the semiconductor device 10 from the bonding tool 100. Then, the NCF 30 and 40 are cured by continuing to supply heat from the bonding tool 100.

Then, the bonding tool 100 is elevated to release the hold on the semiconductor device 10, and mounting of the semiconductor device 10 to the mounting board 20 is completed. The thickness T1 of the NCF 30 is the same as the height h1 of the connection terminals 12, or thicker. The thickness T2 of the NCF 40 is the same as the height h2 of the connection target terminals 22, or thicker. The NCF therefore infills between the semiconductor device 10 and the mounting board 20 without leaving gaps.

Figure 2A:
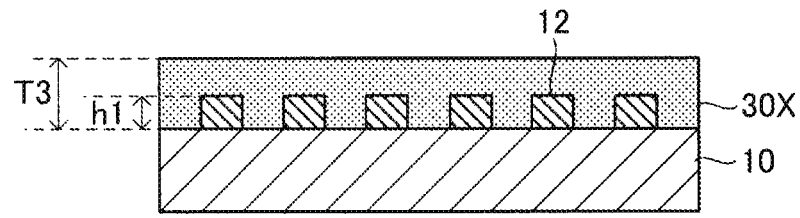
FIG. 2A is a diagram illustrating a semiconductor device mounting method according to a comparative example.
Figure 2B:
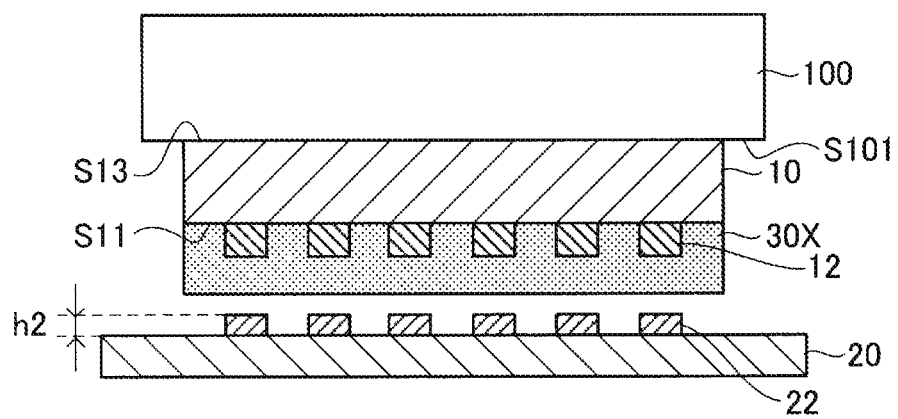
FIG. 2B is a diagram illustrating a semiconductor device mounting method according to the comparative example.
Figure 2C:
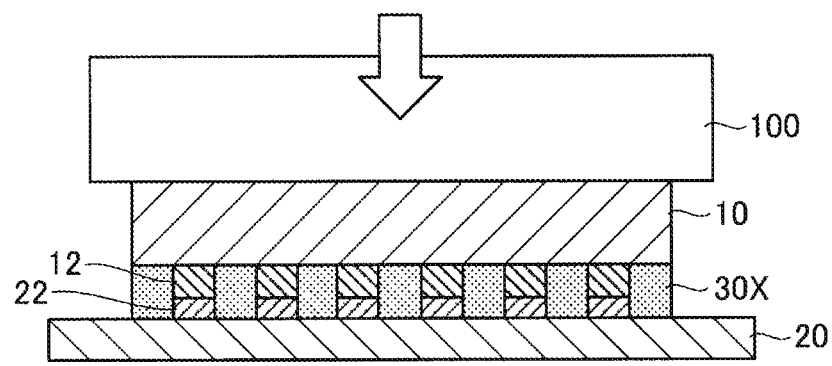
FIG. 2C is a diagram illustrating a semiconductor device mounting method according to the comparative example.

FIG. 2A to FIG. 2C are diagrams illustrating a mounting method for a semiconductor device according to a comparative example. The mounting method according to the comparative example differs from the mounting method according to the technology disclosed herein in that an NCF is applied onto the semiconductor device 10, but is not applied to the mounting board 20.

Initially, an NCF 30X is applied onto the joining face S11 of the semiconductor device 10 (FIG. 2A). The thickness T3 of the NCF 30X employed in the mounting method of the comparative example is a thickness equivalent to the summed height of the height h1 of the connection terminals 12 and the height h2 of the connection target terminals 22, or thicker (T3≥h1+h2). In cases in which NCF is applied onto the semiconductor device 10 alone, the thickness T3 of the NCF 30X needs to be at least equivalent to the summed height of the height h1 of the connection terminals 12 and the height h2 of the connection target terminals 22 in order for NCF to infill between the semiconductor device 10 and the mounting board 20 without leaving gaps after mounting. Namely, the thickness T3 of the NCF 30X according to the comparative example is greater than the thickness T1 of the NCF 30 and the thickness T2 of the NCF 40 of the mounting method of the exemplary embodiment of technology disclosed herein.

Next, the semiconductor device 10 is picked up by suctioning the rear face S13, which is on the opposite side to the side of the joining face S11 of the semiconductor device 10, to the suction face S101 of the bonding tool 100 of the chip bonder. Then, the positions of the semiconductor device 10 and the mounting board 20 are aligned by a position determining mechanism of the chip bonder (FIG. 2B).

Next, the bonding tool 100 is lowered while still holding the semiconductor device 10, and heat is applied to the semiconductor device 10 while the respective connection terminals 12 of the semiconductor device 10 are caused to contact the respective connection target terminals 22 of the mounting board 20 by applying pressure (mounting load) (FIG. 2C). The NCF 30X is temporarily softened by the heat. Surplus NCF 30X extending between the connection terminals 12 and the connection target terminals 22 flows out as it is pressed by the pressure (mounting load) applied from the bonding tool 100. The connection terminals 12 and the connection target terminal 22 thereby contact each other. Then, the NCF 30X is cured by continuing to supply heat from the bonding tool 100.

As described above, in order for the connection terminals 12 and the connection target terminals 22 to be caused to contact each other, mounting load needs to be applied from the bonding tool 100 such that excess NCF extending between the connection terminals 12 and the connection target terminals 22 is caused to flow out. In the mounting method according to the exemplary embodiment of technology disclosed herein, the NCF 30 that is applied onto the joining face S11 of the semiconductor device 10 has a thickness substantially equal to the height h1 of the connection terminals 12, and the NCF 40 that is applied onto the joining target face S21 of the mounting board 20 has a thickness substantially equal to the height h2 of the connection target terminals 22. The thickness of the NCF extending between the connection terminals 12 and the connection target terminals 22 can accordingly be reduced compared to in the mounting method of the comparative example.

NCF can be infilled between the semiconductor device 10 and the mounting board 20 without leaving gaps, while suppressing the thickness of the NCF extending between the connection terminals 12 and the connection target terminals 22 to a minimum, by applying an NCF onto both the semiconductor device 10 and the mounting board 20 in the mounting method according to the exemplary embodiment of technology disclosed herein. The amount of surplus NCF that flows out due to the application of mounting load can be kept to a minimum by suppressing the thickness of the NCF extending between the connection terminals 12 and the connection target terminals 22 to a minimum, and the connection terminals 12 and the connection target terminals 22 can be caused to contact each other by causing hardly any flow in the NCF. Thus, according to the mounting method of the exemplary embodiment of technology disclosed herein, the amount of flow of NCF needed to cause the connection terminals 12 to contact the connection target terminals 22 can be made small compared to the mounting method according to the comparative example. Making the amount of flow of NCF smaller enables the mounting load needed to cause the connection terminals 12 to contact the connection target terminals 22 to be made small. Thus, according to the mounting method of the exemplary embodiment of technology disclosed herein, a reduction in mounting load can be achieved, without resorting to employing low-viscosity NCFs that would lead to spaces (voids) arising. Thus, according to the mounting method for a semiconductor device according the exemplary embodiment of technology disclosed herein, a reduction in the mounting load can be achieved, while suppressing spaces (voids) from arising.

Setting the summed thickness of the thickness of the portion of the NCF 30 covering the leading ends of the connection terminals 12 (T1−h1) and the thickness of the portion of the NCF 40 covering the leading ends of the connection target terminals 22 (T2−h2) lower than a smaller height out of the height of the connection terminals 12 (h1) and the height of the connection target terminals 22 (h2) enables the amount of NCF that needs to flow out in order for the connection terminals 12 to be caused to contact the connection target terminals 22 to be made smaller than in the comparative example. This enables the mounting load to be set smaller than in the comparative example.

Second Exemplary Embodiment

Figure 3:
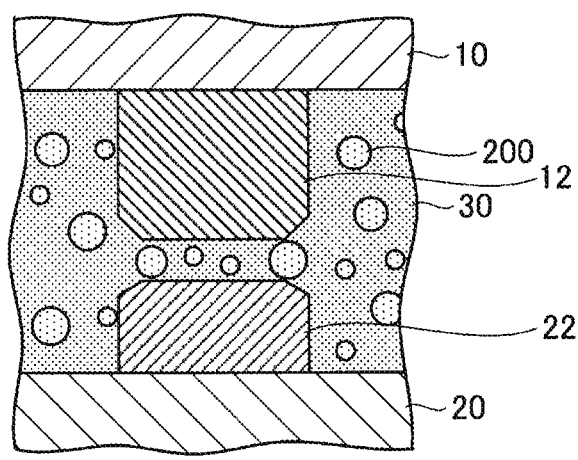
FIG. 3 is a diagram illustrating a state of surroundings of a connection terminal and a connection target terminal.

In order to suppress thermal expansion, a substance containing filler made from an insulator such as silica may be employed in an NCF. There would therefore be a concern that a filler 200 will be clamped between the connection terminals 12 and the connection target terminals connection target terminals 22 when a semiconductor device 10 is mounted to a mounting board 20, as illustrated in FIG. 3. The electrical resistance between terminals is increased when the filler 200 is clamped between the connection terminals 12 and the connection target terminals 22. The mounting method according to a second exemplary embodiment of technology disclosed herein exhibits an advantageous effect of suppressing clamping of filler from arising between the terminals.

FIG. 4A to FIG. 4F are diagrams illustrating a mounting method for a semiconductor device according to the second exemplary embodiment of technology disclosed herein.

Figure 4A:
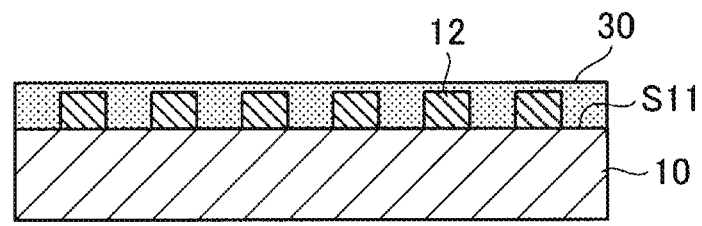
FIG. 4A is a diagram illustrating a semiconductor device mounting method according to a second exemplary embodiment of technology disclosed herein.

Initially, similarly to in the mounting method according to the first exemplary embodiment, an NCF 30 is applied onto a joining face S11 of the semiconductor device 10 (FIG. 4A). Respective connection terminals 12 are embedded within the NCF 30. The NCF 30 is employed with a thickness equal to the height of the connection terminals 12 or with a thickness slightly greater than the height of the connection terminals 12. Namely, the mounting load needed to join the semiconductor device 10 and the mounting board 20 together can be reduced as the thickness of the portion of the NCF 30 covering the leading ends of the connection terminals 12 is set thinner.

Figure 4B:
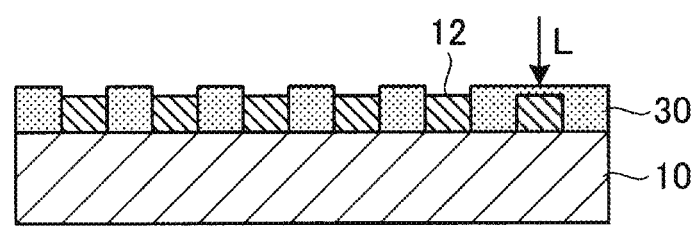
FIG. 4B is a diagram illustrating a semiconductor device mounting method according to the second exemplary embodiment of technology disclosed herein.

Next, the leading end of each of the connection terminals 12 is exposed by eliminating the portion of the NCF 30 covering each of the connection terminals 12 (FIG. 4B). Laser ablation employing laser light L may be employed as the method of partially eliminating the NCF 30. Laser ablation is technology in which material of a solid surface is vaporized by radiating laser light onto the solid surface. An excimer laser may, for example, be employed as the laser light L.

Figure 4C:
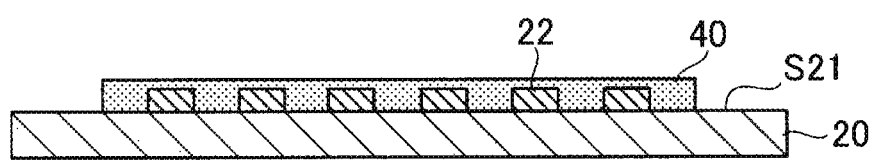
FIG. 4C is a diagram illustrating a semiconductor device mounting method according to the second exemplary embodiment of technology disclosed herein.

Next, similarly to in the mounting method according to the first exemplary embodiment, an NCF 40 that is an insulating film is applied onto a joining target face S21 of a mounting board 20 (FIG. 4C). Connection target terminals 22 are embedded within the NCF 40. The NCF 40 is employed with a thickness equal to the height of the connection target terminals 22, or with a thickness slightly greater than the height of the connection target terminals 22. Namely, the mounting load needed to join the semiconductor device 10 and the mounting board 20 together can be reduced by making the thickness of the portion of the NCF 40 covering the leading ends of the connection target terminals 22 thinner. Moreover, the summed thickness of the thickness of the portion of the NCF 30 covering the leading ends of the connection terminals 12 and the thickness of the portion of the NCF 40 covering the leading ends of the connection target terminals 22 is preferably thinner than the smaller height out of the height of the connection terminals 12 and the height of the connection target terminals 22.

Figure 4D:
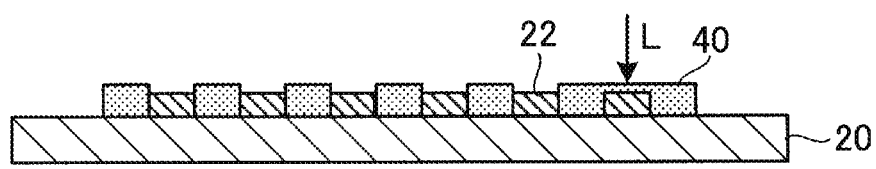
FIG. 4D is a diagram illustrating a semiconductor device mounting method according to the second exemplary embodiment of technology disclosed herein.

Next, the surface of each of the connection target terminals 22 is exposed by eliminating the portion of the NCF 40 covering each of the connection target terminals 22 (FIG. 4D). Laser ablation employing laser light L may be employed as the method of partially eliminating the NCF 40.

Figure 4E:
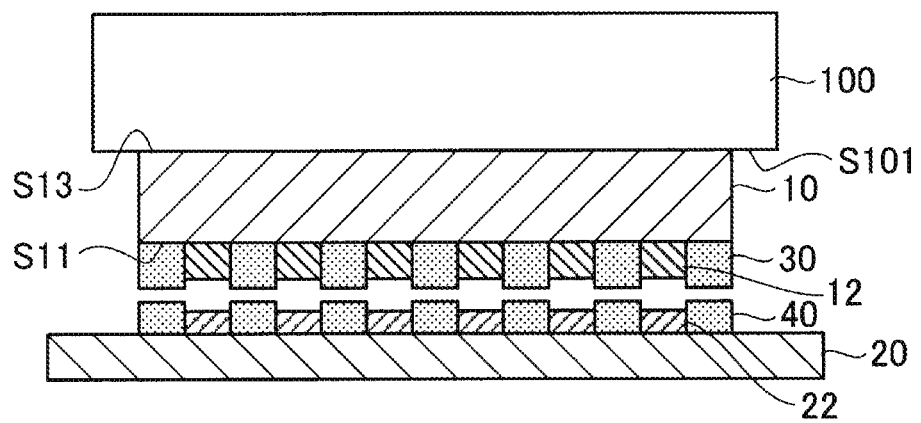
FIG. 4E is a diagram illustrating a semiconductor device mounting method according to the second exemplary embodiment of technology disclosed herein.

Next, the semiconductor device 10 is picked up by suctioning the rear face S13, which is on the opposite side to the side of the joining face S11 of the semiconductor device 10, to the suction face S101 of the bonding tool 100 of the chip bonder. Then, the positions of the semiconductor device 10 and the mounting board 20 are aligned by a position determining mechanism of the chip bonder (FIG. 4E).

Next, the bonding tool 100 is lowered while still holding the semiconductor device 10, and heat is applied to the semiconductor device 10 while the respective connection terminals 12 of the semiconductor device 10 are caused to contact the respective connection target terminals 22 of the mounting board 20 by applying pressure (mounting load)

Figure 4F:
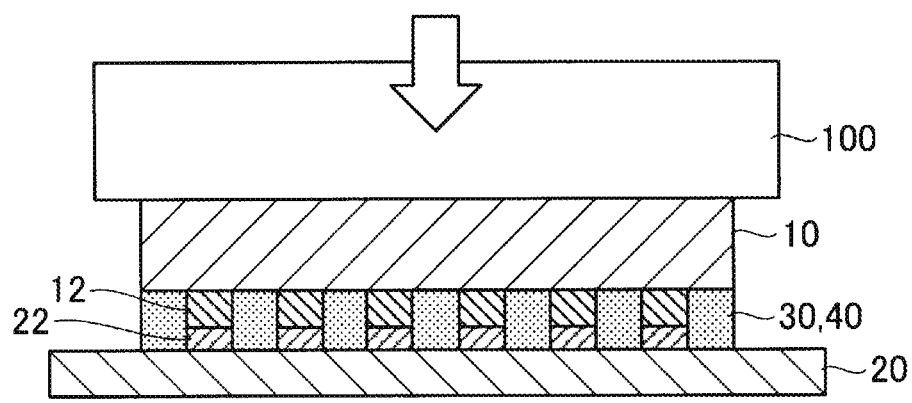
FIG. 4F is a diagram illustrating a semiconductor device mounting method according to the second exemplary embodiment of technology disclosed herein.

(FIG. 4F). The NCF 30 and the NCF 40 are temporarily softened by the heat. The connection terminals 12 and the connection target terminals 22 contact each other due to pressure (mounting load) applied from the bonding tool 100. The NCF 30 and 40 are cured by continuing to supply heat from the bonding tool 100.

Then, the bonding tool 100 is elevated to release the hold on the semiconductor device 10, and mounting of the semiconductor device 10 to the mounting board 20 is completed.

Figure 5:
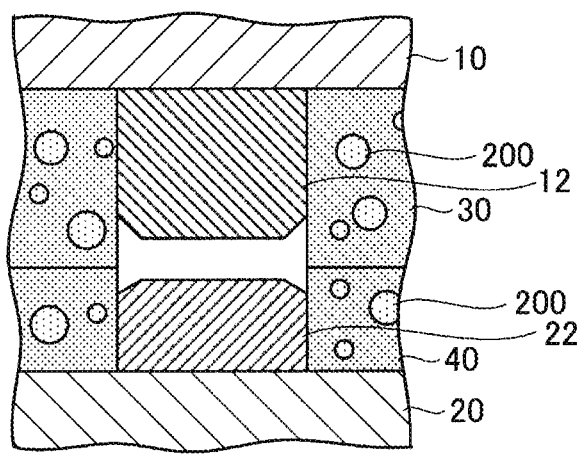
FIG. 5 is a diagram illustrating a state of surroundings of connection terminals and connection target terminals when semiconductor device mounting method is performed according to the second exemplary embodiment of technology disclosed herein.

In the mounting method according to the second exemplary embodiment of technology disclosed herein, prior to affixing the semiconductor device 10 to the mounting board 20, the portion of the NCF 30 covering the leading end of each of the connection terminals 12 is eliminated, and the portion of the NCF 40 covering the leading end of each of the connection target terminals 22 is eliminated, thereby enabling clamping of filler between the connection terminals 12 and the connection target terminals 22 to be suppressed from arising, since NCF is not present between the connection terminals 12 and the connection target terminals 22 when pressure (mounting load) is applied from the bonding tool 100, as illustrated in FIG. 5, meaning that the filler 200 is also not present.

Moreover, in the mounting method according to the second exemplary embodiment of technology disclosed herein, similarly to in the first exemplary embodiment, a reduction of mounting load can be achieved, while suppressing spaces (voids) from arising. This enables application to also be made when the semiconductor device 10 has increased surface area.

Figure 6:
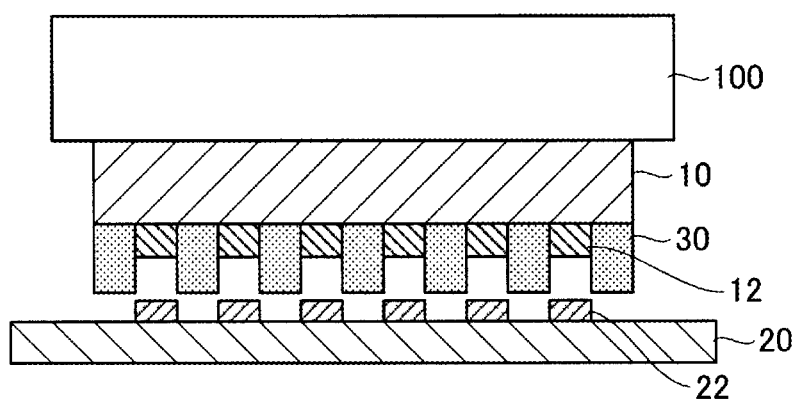
FIG. 6 is a diagram illustrating a semiconductor device mounting method according to another exemplary embodiment of technology disclosed herein.

Note that in the present exemplary embodiment, similarly to in the first exemplary embodiment, an example has been given of a case in which NCF is applied onto both the semiconductor device 10 and the mounting board 20; however, there is no limitation thereto. For example, as illustrated in FIG. 6, the NCF 30 may be applied onto the semiconductor device 10 alone, and the portion of the NCF 30 covering the leading ends of the respective connection terminals 12 eliminated. In such cases also, clamping of filler between the connection terminals 12 and the connection target terminals 22 can be suppressed from arising. Moreover, in such cases, the thickness of the NCF 30 is preferably set to a thickness at least equivalent to the summed height of the height of the connection terminals 12 and the height of the connection target terminals 22. However, the mounting load needed to cause the connection terminals 12 to contact the connection target terminals 22 can be reduced compared to the mounting method according to the comparative example due to eliminating the portion of the NCF 30 covering the leading ends of the respective connection terminals 12.

Third Exemplary Embodiment

Figure 7A:
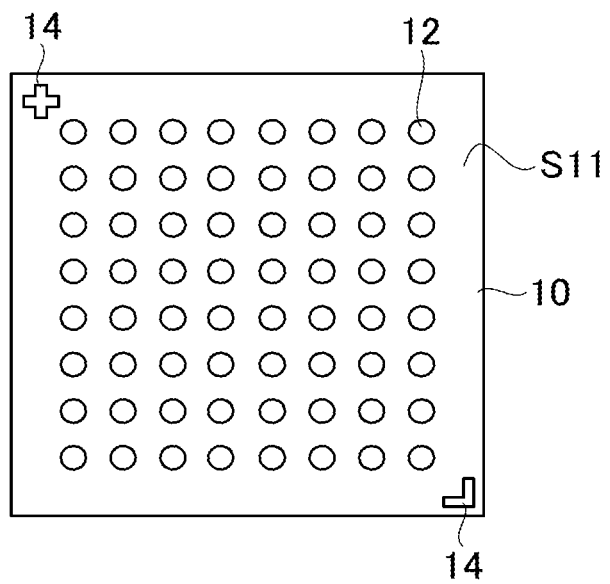
FIG. 7A is a plan view viewed from a joining face side of a semiconductor device according to an exemplary embodiment of technology disclosed herein.
Figure 7B:
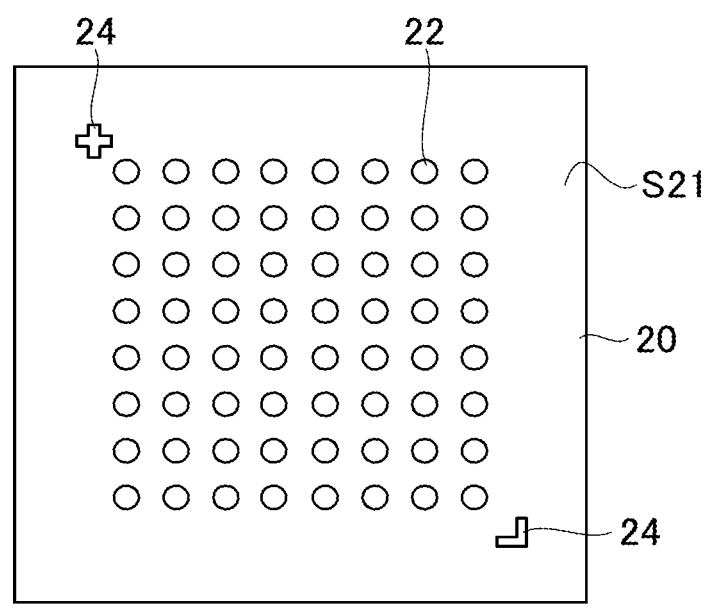
FIG. 7B is a plan view viewed from a joining target face side of a mounting board according to an exemplary embodiment of technology disclosed herein.

FIG. 7A is a plan view of a semiconductor device 10 viewed from a joining face S11 side, and FIG. 7B is a plan view of a mounting board 20 viewed from a joining target face S21 side.

As illustrated in FIG. 7A, the semiconductor device 10 includes plural connection terminals 12 arrayed in a lattice pattern on the joining face S11.

Moreover, a alignment mark 14, for example, is formed on a corner portion of the semiconductor device 10 on the joining face S11. As illustrated in FIG. 7B, the mounting board 20 includes plural connection target terminals 22 arrayed on the joining target face S21 so as to correspond to the array of the connection terminals 12. Moreover, a alignment mark 24, for example, is formed on a corner portion of the mounting board 20 on the joining target face S21. Note that the alignment mark 14 is an example of a first alignment mark of technology disclosed herein, and the alignment mark 24 is an example of a second alignment mark of technology disclosed herein.

The alignment marks 14 and 24 are marks employed when aligning the positions of the semiconductor device 10 and the mounting board 20 when the semiconductor device 10 is being mounted onto the mounting board 20 by a chip bonder. Namely, the chip bonder includes a camera that images the alignment marks 14 and 24, and recognizes the relative positional relationship between the semiconductor device 10 and the mounting board 20 and performs positional alignment of the semiconductor device 10 and the mounting board 20 based on the alignment marks 14 and 24 imaged by the camera.

The alignment marks 14 and 24 are covered by NCF in cases in which NCF is applied onto the semiconductor device 10 and the mounting board 20, such as in the mounting methods according to the first exemplary embodiment and the second exemplary embodiment. This would reduce the visibility of the alignment marks 14 and 24 in the chip bonder, and sometimes make aligning the positions of the semiconductor device 10 and the mounting board 20 difficult. In such cases, NCF having relatively high light transmissivity would need to be employed, narrowing the selectable range of NCFs.

The mounting method according to the third exemplary embodiment of technology disclosed herein exhibits the advantageous effect of increasing the visibility of the alignment marks 14 and 24 without imposing limitations on the NCF employed.

FIG. 8A to FIG. 8E are diagrams illustrating the mounting method according to the third exemplary embodiment of technology disclosed herein.

Initially, similarly to in the mounting method according to the first exemplary embodiment, an NCF 30 is applied onto a joining face S11 of the semiconductor device 10. Respective connection terminals 12 are embedded within the NCF 30. Moreover, the alignment mark 14 formed on the joining face S11 of the semiconductor device 10 is covered by the NCF 30. The NCF 30 is employed with a thickness equal to the height of the connection terminals 12 or with a thickness slightly greater than the height of the connection terminals 12. Namely, the mounting load needed to join the semiconductor device 10 and the mounting board 20 together can be reduced as the thickness of the portion of the NCF 30 covering the leading ends of the connection terminals 12 is set thinner.

Figure 8A:
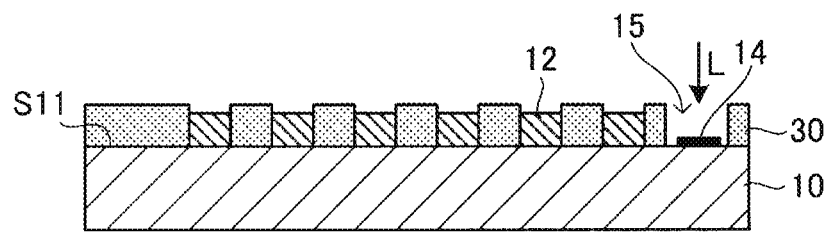
FIG. 8A is a diagram illustrating a semiconductor device mounting method according to a third exemplary embodiment of technology disclosed herein.

Next, the leading end of each of the connection terminals 12 is exposed by eliminating the portion of the NCF 30 covering each of the connection terminals 12. Moreover, the portion of the NCF 30 covering the alignment mark 14 is eliminated, thereby forming an opening 15 (FIG. 8A). Laser ablation employing laser light L may be employed as the method of partially eliminating the NCF 30.

Figure 8B:
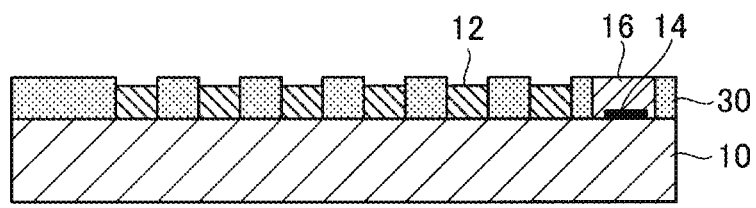
FIG. 8B is a diagram illustrating a semiconductor device mounting method according to the third exemplary embodiment of technology disclosed herein.

Next, a thermosetting resin 16 having higher light transmissivity than the resin configuring the NCF 30 is infilled into the opening 15 formed by eliminating the portion of the NCF 30 covering the alignment mark 14 (FIG. 8B). For example, a non-filler resin containing no filler may be employed as the resin 16.

Next, similarly to in the mounting method according to the first exemplary embodiment, an NCF 40 that is an insulating film is applied onto a joining target face S21 of a mounting board 20. Connection target terminals 22 are embedded within the NCF 40. Moreover, the alignment mark 24 formed in the joining target face S21 of the mounting board 20 is covered by the NCF 40. The NCF 40 is employed with a thickness equal to the height of the connection target terminals 22, or with a thickness slightly greater than the height of the connection target terminals 22. Namely, the mounting load needed to join the semiconductor device 10 and the mounting board 20 together can be reduced by making the thickness of the portion of the NCF 40 covering the leading ends of the connection target terminals 22 thinner. Moreover, the summed thickness of the thickness of the portion of the NCF 30 covering the leading ends of the connection terminals 12 and the thickness of the portion of the NCF 40 covering the leading ends of the connection target terminals 22 is preferably thinner than the smaller height out of the height of the connection terminals 12 and the height of the connection target terminals 22.

Figure 8C:
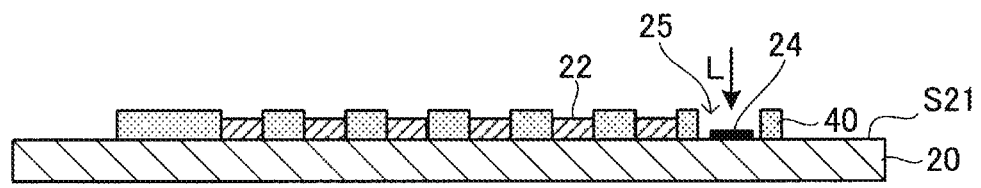
FIG. 8C is a diagram illustrating a semiconductor device mounting method according to the third exemplary embodiment of technology disclosed herein.

Next, the leading end of each of the connection target terminals 22 is exposed by eliminating the portion of the NCF 40 covering each of the connection target terminals 22. Moreover, the portion of the NCF 40 covering the alignment mark 24 is eliminated, thereby forming an opening 25 (FIG. 8C). Laser ablation employing laser light L may be employed as the method of partially eliminating the NCF 40.

Figure 8D:
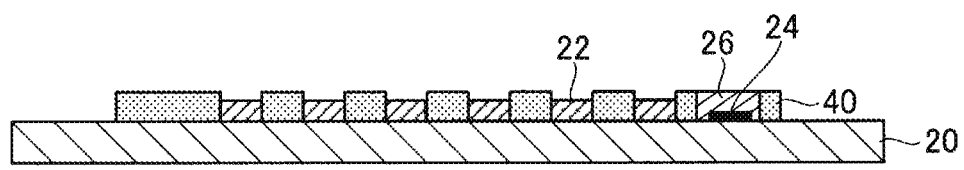
FIG. 8D is a diagram illustrating a semiconductor device mounting method according to the third exemplary embodiment of technology disclosed herein.

Next, a thermosetting resin 26 having higher light transmissivity than the resin configuring the NCF 40 is infilled into the opening 25 formed by eliminating the portion of the NCF 40 covering the alignment mark 24 (FIG. 8D). For example, a non-filler resin containing no filler may be employed as the resin 26. The resin 26 may be the same resin as the resin 16.

Figure 8E:
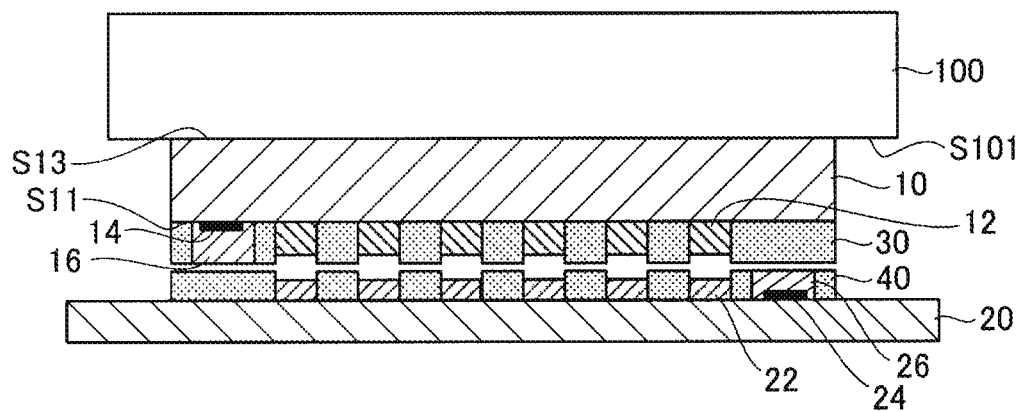
FIG. 8E is a diagram illustrating a semiconductor device mounting method according to the third exemplary embodiment of technology disclosed herein.

Next, the semiconductor device 10 is picked up by suctioning a rear face S13, which is on the opposite side to the side of the joining face S11 of the semiconductor device 10, to a suction face S101 of a bonding tool 100 of a chip bonder. Then, the positions of the semiconductor device 10 and the mounting board 20 are aligned by a position determining mechanism of the chip bonder (FIG. 8E). The chip bonder includes a camera that images the alignment marks 14 and 24, and the relative positional relationship between the semiconductor device 10 and the mounting board 20 is recognized, and both are aligned in position, based on the alignment marks 14 and 24 imaged by the camera. The resins 16 and 26 covering the alignment marks 14 and 24 respectively have relatively high light transmissivity, enabling the alignment marks 14 and 24 to be recognized appropriately.

Next, the bonding tool 100 is lowered while still holding the semiconductor device 10, and heat is applied to the semiconductor device 10 while of the respective connection terminals 12 of the semiconductor device 10 are caused to contact the respective connection target terminals 22 of the mounting board 20 by applying pressure. The NCF 30 and the NCF 40 are temporarily softened by the heat. The connection terminals 12 and the connection target terminals 22 contact each other due to pressure applied from the bonding tool 100. The NCF 30 and 40 are cured by continuing to supply heat from the bonding tool 100. Then, the bonding tool 100 is elevated to release the hold on the semiconductor device 10, and mounting of the semiconductor device 10 to the mounting board 20 is completed.

As described above, in the mounting method according to the third exemplary embodiment, the alignment marks 14 and 24 are respectively covered by the resins 16 and 26 that have higher light transmissivity than the resins configuring the NCFs 30 and 40, thereby enabling the semiconductor device 10 and the mounting board 20 to be aligned appropriately. Thus the issue described above of narrowing the selectable range of the NCF can be resolved by substituting the portion of the NCFs 30 and 40 that cover the alignment marks 14 and 24 with another resin having higher light transmissivity. Note that the process of infilling the resins 16 and 26 into the openings 15 and 25 formed by eliminating the portions NCF covering the alignment marks 14 and 24 may be omitted. However, in such cases, spaces (voids) are formed in the NCF. In cases in which there is a concern that reliability will be lowered by these spaces (voids), it is preferable to prevent spaces (voids) from arising by infilling resin into the openings 15 and 25.

Moreover, in the mounting method according to the third exemplary embodiment, similarly to in the first exemplary embodiment, a reduction of mounting load can also be achieved while suppressing spaces (voids) from arising. This enables application to also be made when the semiconductor device 10 has increased surface area. Moreover, in the mounting method according to the third exemplary embodiment, similarly to in the second exemplary embodiment, clamping of filler between the connection terminals 12 and the connection target terminals 22 can be suppressed from arising.

Note that in the exemplary embodiments above, examples have been given of cases in which the portion of the NCF 30 covering the leading ends of the respective connection terminals 12 is eliminated, and the portion of the NCF 40 covering the leading ends of the respective connection target terminals 22 is eliminated; however, the elimination of the portion of NCF covering the leading ends of the respective terminals may be omitted. Namely, the portion of the NCF covering the alignment marks 14 and 24 alone may be eliminated from the semiconductor device 10 and the mounting board 20 respectively after NCF has been applied thereon, and both may be affixed together using the chip bonder after the openings that were thus formed have been infilled by the resins 16 and 26.

Fourth Exemplary Embodiment

FIG. 9A to FIG. 9D are diagrams illustrating a mounting method for a semiconductor device according to a fourth exemplary embodiment of technology disclosed herein.

Figure 9A:
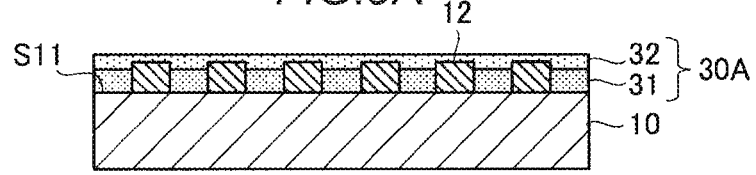
FIG. 9A is a diagram illustrating a semiconductor device mounting method according to a fourth exemplary embodiment of technology disclosed herein.

Initially, an NCF 30A is applied onto a joining face S11 of a semiconductor device 10 (FIG. 9A). Respective connection terminals 12 are embedded within the NCF 30A. The NCF 30A has a two-layer structure including a resin layer 31 containing a filler, and a resin layer 32 having a lower filler content than the resin layer 31 or containing no filler. The resin layer 31 has relatively high filler content, and is disposed on a base side (attachment base side) of the connection terminals 12. The resin layer 32 has relatively low filler content or contains no filler, and is disposed on a leading end side of the connection terminals 12. Namely, the leading ends of the respective connection terminals 12 are covered by the resin layer 32. The NCF 30A is employed with an overall thickness the same as the height of the connection terminals 12 or with an overall thickness slightly thicker than the height of the connection terminals 12. Namely, the mounting load needed to join the semiconductor device 10 and the mounting board 20 together can be reduced to the extent that the thickness of the portion of the NCF 30A covering the leading ends of the connection terminals 12 is reduced. Note that the resin layer 31 is an example of a first layer of technology disclosed herein, and the resin layer 32 is an example of a second layer of technology disclosed herein.

Figure 9B:
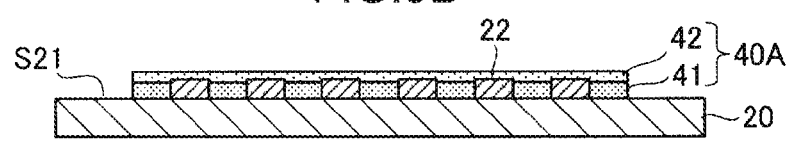
FIG. 9B is a diagram illustrating a semiconductor device mounting method according to the fourth exemplary embodiment of technology disclosed herein.

Next, an NCF 40A is applied onto a joining target face S21 of a mounting board 20 (FIG. 9B). Connection target terminals 22 are each embedded within the NCF 40A. Similarly to the NCF 30A, the NCF 40A has a two-layer structure including a resin layer 41 containing a filler, and a resin layer 42 having a lower filler content than the resin layer 41 or containing no filler. The resin layer 41 has relatively high filler content, and is disposed on a base side (attachment base side) of the connection terminals 12. The resin layer 42 has relatively low filler content or contains no filler, and is disposed on a leading end side of the connection terminals 12. Namely, the leading ends of the respective connection target terminals 22 are covered by the resin layer 42. The NCF 40A is employed with an overall thickness equal to the height of the connection target terminals 22, or with an overall thickness slightly greater than the height of the connection target terminals 22. Namely, the mounting load needed to join the semiconductor device 10 and the mounting board 20 together can be reduced by making the thickness of the portion of the NCF 40A covering the leading ends of the connection target terminals 22 thinner. Moreover, the summed thickness of the thickness of the portion of the NCF 30A covering the leading ends of the connection terminals 12 and the thickness of the portion of the NCF 40A covering the leading ends of the connection target terminals 22 is preferably thinner than the smaller height out of the height of the connection terminals 12 and the height of the connection target terminals 22.

Figure 9C:
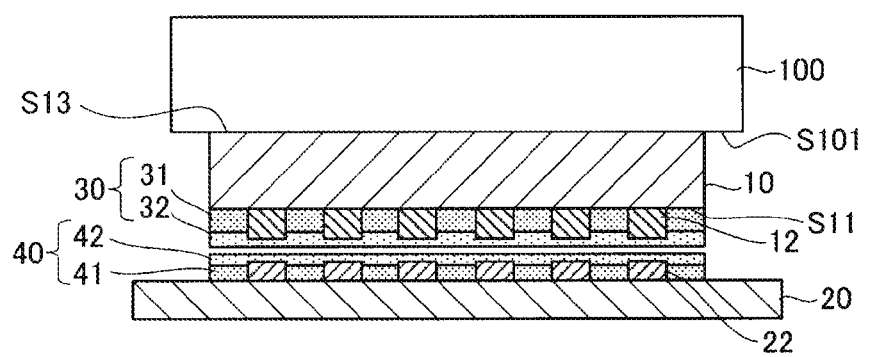
FIG. 9C is a diagram illustrating a semiconductor device mounting method according to the fourth exemplary embodiment of technology disclosed herein.

Next, the semiconductor device 10 is picked up by suctioning a rear face S13, which is on the opposite side to the side of the joining face S11 of the semiconductor device 10, to a suction face S101 of a bonding tool 100 of a chip bonder. Then, the positions of the semiconductor device 10 and the mounting board 20 are aligned by a position determining mechanism of the chip bonder (FIG. 9C).

Figure 9D:
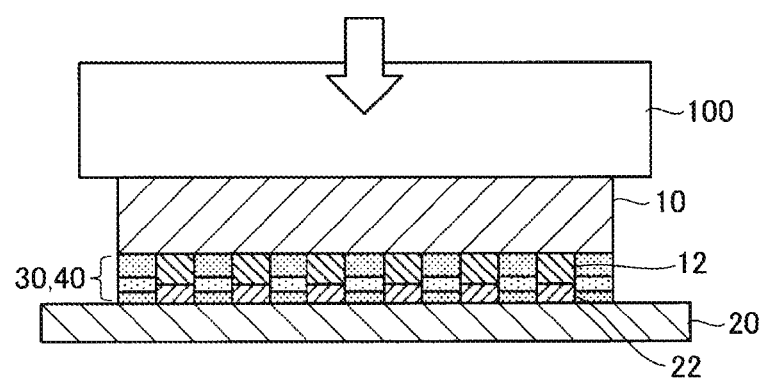
FIG. 9D is a diagram illustrating a semiconductor device mounting method according to the fourth exemplary embodiment of technology disclosed herein.

Next, the bonding tool 100 is lowered while still holding the semiconductor device 10, and heat is applied to the semiconductor device 10 while of the respective connection terminals 12 of the semiconductor device 10 are caused to contact the respective connection target terminals 22 of the mounting board 20 by applying pressure (mounting load) (FIG. 9D). The NCF 30A and the NCF 40A are temporarily softened by the heat. The NCFs 30A and 40A extending between the connection terminals 12 and the connection target terminals 22 are pressed and caused to flow out, and the connection terminals 12 and the connection target terminals 22 contact each other, due to pressure (mounting load) applied from the bonding tool 100. The NCF 30A and 40A are cured by continuing to supply heat from the bonding tool 100. Then, the bonding tool 100 is elevated to release the hold on the semiconductor device 10, and mounting of the semiconductor device 10 to the mounting board 20 is completed.

Figure 10:
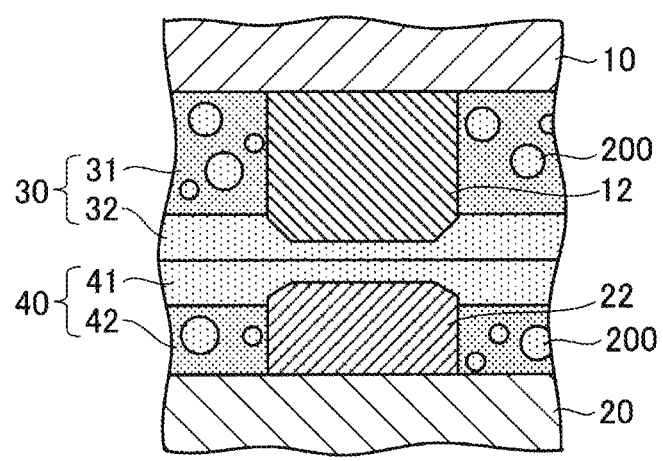
FIG. 10 is a diagram illustrating a state of surroundings of connection terminals and connection target terminals when a semiconductor device mounting method according to the fourth exemplary embodiment of technology disclosed herein is performed.

In the mounting method according to the fourth exemplary embodiment of technology disclosed herein, the resin layers 32 and 42, which have relatively low filler content or contain no filler, are formed at the leading end sides of the connection terminals 12 and the connection target terminals 22, respectively. As a result, as illustrated in FIG. 10, the resin layers 32 and the 42 extend between the connection terminals 12 and the connection target terminals 22 when pressure (mounting load) from the bonding tool 100 is applied. Clamping of filler between the connection terminals 12 and the connection target terminals 22 is thereby suppressed from arising. Moreover, the resin layers 32 and 42 disposed at the leading end sides of the respective terminals have relatively low filler content or contain no filler, such that the viscosity of the resin layers 32 and 42 is lower than the viscosity of the resin layers 31 and 41 disposed at the base side of the respective terminals. The flowability of the NCF at the leading end sides of the connection terminals 12 and connection target terminals 22 is thereby raised, enabling elimination of filler present between the connection terminals 12 and the connection target terminals 22 to be promoted when the mounting load is being applied. Moreover, the mounting load can be reduced.

The resin layers 31 and 41 that have relatively high content of the filler 200 are formed at the base side of the connection terminals 12 and the connection target terminals 22, respectively. The NCFs 30A and 40A respectively include the resin layers 31 and 41 that have a specific filler content, enabling thermal expansion of NCF to be suppressed, and enabling reliability to be secured.

Moreover, in the mounting method according to the fourth exemplary embodiment of technology disclosed herein, similarly to in the first exemplary embodiment, a reduction of mounting load can be achieved while suppressing spaces (voids) from arising. This enables application to also be made when the semiconductor device 10 has increased surface area.

Note that the mounting method according to the present exemplary embodiment may further include the process of eliminating the portion of NCF covering the alignment marks, and the process of filling resin that has relatively high light transmissivity into the openings formed thereby, similarly to in the mounting method according to the third exemplary embodiment described above. Moreover, the mounting method according to the present exemplary embodiment may further include the process of exposing the leading ends of each terminal by eliminating the portion of the NCFs 30 and 40 covering the leading ends of the respective connection terminals 12 and connection target terminals 22, as in the mounting method according to the second exemplary embodiment described above.

Fifth Exemplary Embodiment

FIG. 11A to FIG. 11D are diagrams illustrating a mounting method for a semiconductor device according to a fifth exemplary embodiment of technology disclosed herein.

Initially, similarly to in the mounting method according to the first exemplary embodiment, an NCF 30 is applied onto a joining face S11 of the semiconductor device 10. Respective connection terminals 12 are embedded within the NCF 30. The NCF 30 is employed with a thickness equal to the height of the connection terminals 12 or with a thickness slightly greater than the height of the connection terminals 12. Namely, the mounting load needed to join the semiconductor device 10 and the mounting board 20 together can be reduced as the thickness of the portion of the NCF 30 covering the leading ends of the connection terminals 12 is set thinner.

Figure 11A:
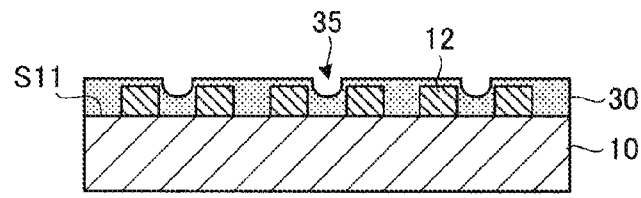
FIG. 11A is a diagram illustrating a semiconductor device mounting method according to a fifth exemplary embodiment of technology disclosed herein.
Figure 12:
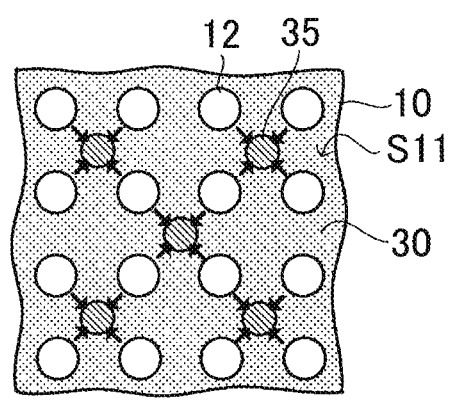
FIG. 12 is a plan view illustrating a state of a joining face side of a semiconductor device according to the fifth exemplary embodiment of technology disclosed herein.

Next, plural recesses (cavities) 35 are formed in the NCF 30 by eliminating the surface layer portion of the portion of the NCF 30 corresponding to the surrounding portions of the connection terminals 12 (the portion corresponding to the spaces between the connection terminals 12) (FIG. 11A). FIG. 12 is a partial plan view of the semiconductor device 10 as viewed from a joining face S11 side after forming the recesses 35. As illustrated in FIG. 12, the recesses 35 are formed in the surrounding portions of the connection terminals 12 (the space portions between the connection terminals 12). For example, laser ablation by laser light such as an excimer laser may be employed as the method of partially eliminating the NCF 30. The recesses 35 are an example of a first recesses of technology disclosed herein.

Next, similarly to in the mounting method according to the first exemplary embodiment, an NCF 40 that is an insulating film is applied onto a joining target face S21 of a mounting board 20. Each of the connection target terminals 22 is embedded within the NCF 40. The NCF 40 is employed with a thickness equal to the height of the connection target terminals 22, or with a thickness slightly greater than the height of the connection target terminals 22. Namely, the mounting load needed to join the semiconductor device 10 and the mounting board 20 together can be reduced by making the thickness of the portion of the NCF 40 covering the leading ends of the connection target terminals 22 thinner. Moreover, the summed size of the thickness of the portion of the NCF 30 covering the leading ends of the connection terminals 12 and the thickness of the portion of the NCF 40 covering the leading ends of the connection target terminals 22 is preferably smaller than the smaller height out of the height of the connection terminals 12 and the height of the connection target terminals 22.

Figure 11B:
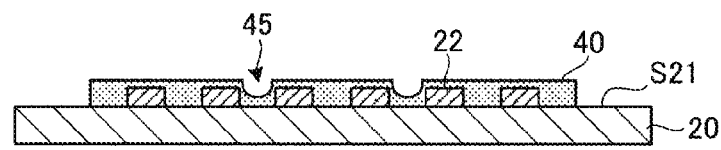
FIG. 11B is a diagram illustrating a semiconductor device mounting method according to the fifth exemplary embodiment of technology disclosed herein.

Next, plural recesses (cavities) 45 are formed in the NCF 40 by eliminating the surface layer portion of the portion of the NCF 40 corresponding to the surrounding portions of the connection target terminals 22 (the portion corresponding to the space portions between the connection target terminals 22) (FIG. 11B). For example, laser ablation by laser light such as an excimer laser may be employed as the method of partially eliminating the NCF 40. It is preferable that each of the recesses are disposed at positions such that the recesses 35 are not superimposed on the respective recesses 45 when the semiconductor device 10 and the mounting board 20 are joined together. The recesses 45 are an example of a second recesses of technology disclosed herein.

Figure 11C:
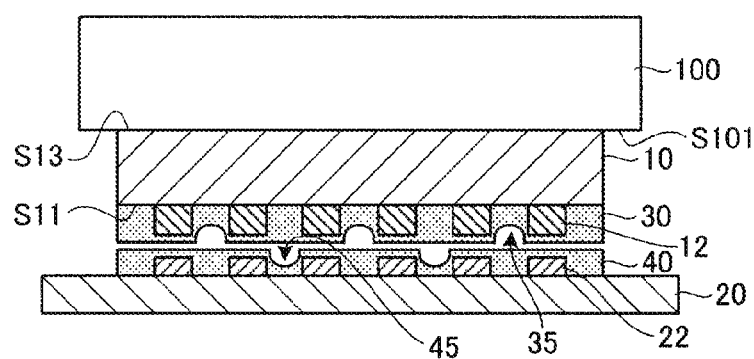
FIG. 11C is a diagram illustrating a semiconductor device mounting method according to the fifth exemplary embodiment of technology disclosed herein.

Next, the semiconductor device 10 is picked up by suctioning a rear face S13, which is on the opposite side to the side of the joining face S11 of the semiconductor device 10, to a suction face S101 of a bonding tool 100 of a chip bonder. Then, the positions of the semiconductor device 10 and the mounting board 20 are aligned by a position determining mechanism of the chip bonder (FIG. 11C).

Figure 11D:
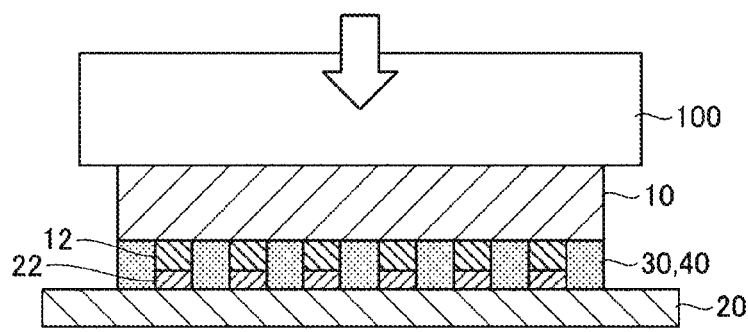
FIG. 11D is a diagram illustrating a semiconductor device mounting method according to the fifth exemplary embodiment of technology disclosed herein.

Next, the bonding tool 100 is lowered while still holding the semiconductor device 10, and heat is applied to the semiconductor device 10 while the respective connection terminals 12 of the semiconductor device 10 are caused to contact the respective connection target terminals 22 of the mounting board 20 by applying pressure (FIG. 11D). The NCF 30 and the NCF 40 are temporarily softened by the heat. The NCFs 30 and 40 extending between the connection terminals 12 and the connection target terminals 22 are pressed and caused to flow out, and the connection terminals 12 and the connection target terminals 22 contact each other, due to pressure (mounting load) applied from the bonding tool 100. The NCF 30 and 40 are cured by continuing to supply heat from the bonding tool 100. Then, the bonding tool 100 is elevated to release the hold on the semiconductor device 10, and mounting of the semiconductor device 10 to the mounting board 20 is completed.

As described above, the NCFs 30 and 40 extending between the connection terminals 12 and the connection target terminals 22 is pressed and caused to flow out by applying pressure (mounting load) from the bonding tool 100. In the mounting method according to the fifth exemplary embodiment of technology disclosed herein, the NCF pressed out by application of the mounting load is held in the recesses 35 and 45. The arrows illustrated in FIG. 12 indicate the NCF 30 pressed out by the connection terminals 12 moving so as to be held in the recesses 35.

Thus, the NCF that flows due to application of the mounting load is held in the recesses 35 and 45 formed in the vicinity of the connection terminals 12 and the connection target terminals 22, thereby enabling the mounting load to be set smaller than in cases in which the recesses 35 and 45 are not formed. Namely, in cases in which the recesses 35 and 45 are not formed, a greater mounting load is needed since the NCF, extending from the region corresponding to the central portion of the semiconductor device 10 to the region corresponding to the outer peripheral portion, is caused to flow as a whole. However, in cases in which the recesses 35 and 45 are formed in the vicinities of the connection terminals 12 and the connection target terminals 22, the NCF that flows due to being pushed out in each region is held in the vicinity in the recesses 35 and 45, and the NCF does not flow as a whole. The mounting load can therefore be set lower than in cases in which the recesses 35 and 45 are not formed.

Moreover, spaces (voids) can be suppressed form arising within the NCF by disposing each of the recesses such that recesses 35 and the recesses 45 are not superimposed on each other when the semiconductor device 10 and the mounting board 20 have been joined.

Figure 13:
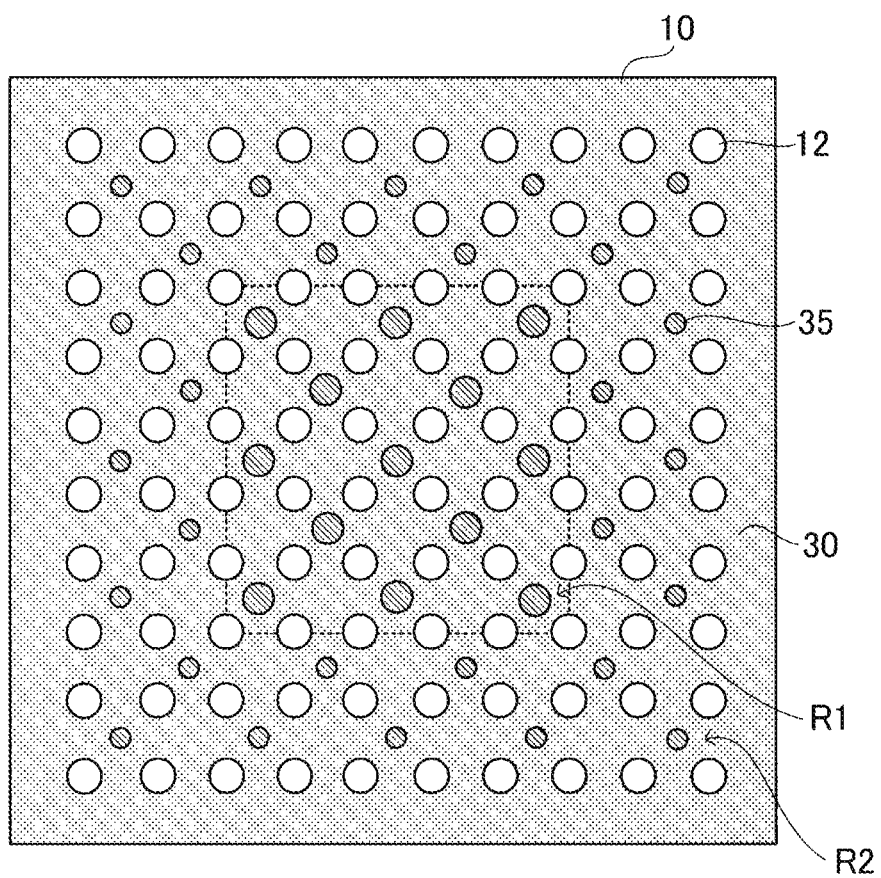
FIG. 13 is a plan view illustrating a state of a joining face side of a semiconductor device according to the fifth exemplary embodiment of technology disclosed herein.

Note that the sizes of the plural recesses 35 formed in the NCF 30 may be the same as each other. Moreover, as illustrated in FIG. 13, the size of each of the recesses 35 formed in a region R1 corresponding to the central portion of the semiconductor device 10 (the region inside the dashed line) may be greater than the size of each of the recesses 35 formed in a region corresponding to the outer peripheral portion of the semiconductor device 10 (outside of the dashed line). In a region R2 corresponding to the outer peripheral portion of the semiconductor device 10, surplus NCF that flows due to application of the mounting load can be expelled from the outer edge of the semiconductor device 10. Therefore, even when each of the recesses 35 formed in the region R2 corresponding to the outer peripheral portion of the semiconductor device 10 is set smaller than each of the recesses 35 formed in the region R1 corresponding to the central portion of the semiconductor device 10, this has little influence on the applied mounting load.

Similarly to the NCF 30, the sizes of the plural recesses 45 formed in the NCF 40 may be the same as each other. Moreover, the sizes of each of the recesses 45 formed in a region corresponding to the central portion of the semiconductor device 10 may be greater than the sizes of each of the recesses 45 formed in the region corresponding to the outer peripheral portion of the semiconductor device 10.

Note that although an example has been given of a case in which the recesses are provided in both the NCF 30 and the NCF 40 in the present exemplary embodiment, the recesses may be formed in one out of the NCF 30 or the NCF 40 alone.

The mounting method according to the present exemplary embodiment may further include the process of eliminating portions of the NCF covering the alignment marks, and the process of filling resin that has relatively high light transmissivity into the openings formed thereby, similarly to in the mounting method according to the third exemplary embodiment described above.

Moreover, in the mounting method according to the present exemplary embodiment, similarly to in the mounting method according to the fourth exemplary embodiment described above, an NCF having a two-layer structure may be employed, in which the two layers have different content of filler.

One aspect of technology disclosed herein exhibits the advantageous effect of enabling a reduction in mounting load to be achieved, while suppressing spaces from arising in a mounting method for a semiconductor device using an NCF method.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device mounting method comprising:
preparing the semiconductor device, a joining face of which includes a connection terminal;
preparing a joining target, a joining target face of which includes a connection target terminal;
applying a first insulating film including a thermosetting resin onto the joining face of the semiconductor device having the connection terminal on the joining face, and embedding the connection terminal inside the first insulating film;
applying a second insulating film including a thermosetting resin onto the joining target face of the joining target having the connection target terminal on the joining target face, and embedding the connection target terminal inside the second insulating film; and
applying pressure that causes the connection terminal and the connection target terminal to contact each other, while curing the first insulating film and the second insulating film by heating, thereby joining the semiconductor device to the joining target.

2. The mounting method of claim 1,
wherein the semiconductor device includes a first alignment mark on the joining face, and the first alignment mark is covered by the first insulating film when the first insulating film is being applied onto the joining face;
wherein the joining target includes a second alignment mark on the joining target face, and the second alignment mark is covered by the second insulating film when the second insulating film is being applied onto the joining target face;
prior to the joining the semiconductor device and the joining target together:
eliminating a portion of the first insulating film covering the first alignment mark; and
eliminating a portion of the second insulating film covering the second alignment mark; and
wherein the joining the semiconductor device and the joining target together, alignment of the semiconductor device with the joining target is performed by imaging the first alignment mark and the second alignment mark.

3. The mounting method of claim 2, further comprising, prior to the joining the semiconductor device and the joining target together:
filling an opening formed by eliminating the portion of the first insulating film covering the first alignment mark with an insulator having higher light transmissivity than the first insulating film; and
filling an opening formed by eliminating the portion of the second insulating film covering the second alignment mark with an insulator having higher light transmissivity than the second insulating film.

4. The mounting method of claim 1, wherein:
the first insulating film includes
a first layer that is disposed at a base side of the connection terminal and that contains filler, and
a second layer that is disposed at a leading end side of the connection terminal and that has a lower content of filler than the first layer or does not contain filler; and
the second insulating film includes
a third layer that is disposed at a base side of the connection target terminal and that contains filler, and
a fourth layer that is disposed at a leading end side of the connection target terminal and that has a lower content of filler than the third layer or does not contain filler.

5. The mounting method of claim 1, further comprising, prior to the joining the semiconductor device and the joining target together:
forming a plurality of first recesses in portions of the first insulating film corresponding to portions surrounding the connection terminal.

6. The mounting method of claim 5, further comprising, prior to the joining the semiconductor device and the joining target together:
forming a plurality of second recesses in portions of the second insulating film corresponding to portions surrounding the connection target terminal,
wherein each of the first recesses and each of the second recesses are disposed such that the respective first recesses are not superimposed on the respective second recesses when the semiconductor device and the joining target have been joined together.

7. The mounting method of claim 6, wherein:
among the plurality of second recesses, sizes of each of the recesses formed in a region corresponding to an outer peripheral portion of the semiconductor device are smaller than sizes of each of the recesses formed in a region corresponding to a central portion of the semiconductor device.

8. The mounting method of claim 6, wherein:
among the plurality of first recesses, sizes of each of the recesses formed in a region corresponding to an outer peripheral portion of the semiconductor device are smaller than sizes of each of the recesses formed in a region corresponding to a central portion of the semiconductor device; and
among the plurality of second recesses, sizes of each of the recesses formed in a region corresponding to an outer peripheral portion of the semiconductor device are smaller than sizes of each of the recesses formed in a region corresponding to a central portion of the semiconductor device.

9. The mounting method of claim 6, wherein:
the plurality of respective second recesses are formed by eliminating a surface portion of the second insulating film using laser light.

10. The mounting method of claim 5, wherein:
among the plurality of first recesses, sizes of each of the recesses formed in a region corresponding to an outer peripheral portion of the semiconductor device are smaller than sizes of each of the recesses formed in a region corresponding to a central portion of the semiconductor device.

11. The mounting method of claim 5, wherein:
the plurality of respective first recesses are formed by eliminating a surface portion of the first insulating film using laser light.

12. The mounting method of claim 1, wherein:
a thickness of the first insulating film is equal to a height of the connection terminal or is thicker than the height of the connection terminal;
a thickness of the second insulating film is equal to a height of the connection target terminal or is thicker than the height of the connection target terminal; and
a summed thickness of a thickness of a portion of the first insulating film covering a leading end of the connection terminal and a thickness of a portion of the second insulating film covering a leading end of the connection target terminal is thinner than a smaller height out of the height of the connection terminal and the height of the connection target terminal.

13. A semiconductor device mounting method comprising:
preparing the semiconductor device, a joining face of which includes a connection terminal;
preparing a joining target, a joining target face of which includes a connection target terminal;
applying a first insulating film including a thermosetting resin onto the joining face of the semiconductor device having the connection terminal on the joining face, and embedding the connection terminal inside the first insulating film;
exposing a leading end of the connection terminal by eliminating a portion of the first insulating film covering the leading end of the connection terminal;
applying pressure that causes the connection target terminal of the joining target that includes the connection target terminal on the joining target face to contact the connection terminal, while curing the first insulating film by heating, thereby joining the semiconductor device to the joining target; and
applying a second insulating film including a thermosetting resin onto the joining target face of the joining target and embedding the connection target terminal inside the second insulating film; and
exposing a leading end of the connection target terminal by eliminating a portion of the second insulating film covering the leading end of the connection target terminal.

14. The mounting method of claim 13, wherein the portion of the first insulating film covering the leading end of the connection terminal, and the portion of the second insulating film covering the leading end of the connection target terminal, are eliminated using laser light.

* * * * *